United States Patent [19]
Ker et al.

[11] Patent Number: 5,473,169
[45] Date of Patent: Dec. 5, 1995

[54] COMPLEMENTARY-SCR ELECTROSTATIC DISCHARGE PROTECTION CIRCUIT

[75] Inventors: Ming-Dou Ker, Tainan Hsien; Chung-Yu Wu, Hsinchu; Chung-Yuan Lee, Chungli; Joe Ko, Hsinchu, all of Taiwan

[73] Assignee: United Microelectronics Corp., Hsinchu, Taiwan

[21] Appl. No.: 406,170

[22] Filed: Mar. 17, 1995

[51] Int. Cl.$^6$ .............................. H01L 29/74; H01L 29/06
[52] U.S. Cl. ........................ 257/173; 257/362; 257/363; 361/91; 361/100
[58] Field of Search ..................................... 257/126, 128, 257/164, 165, 356, 361, 362, 355, 491, 173, 174; 361/57, 91, 93, 100, 101, 111

[56] References Cited

U.S. PATENT DOCUMENTS

| | | | |
|---|---|---|---|
| 4,939,616 | 7/1990 | Rountree | 361/56 |
| 5,012,317 | 4/1991 | Rountre | 257/173 |
| 5,235,201 | 8/1993 | Honna | 257/357 |
| 5,272,371 | 12/1993 | Bishop et al. | 257/362 |
| 5,359,211 | 10/1994 | Croft | 257/173 |

FOREIGN PATENT DOCUMENTS 5-6958  1/1993  Japan ........................... 257/173

*Primary Examiner*—Donald L. Monin
*Attorney, Agent, or Firm*—Ladas & Parry

[57] ABSTRACT

A complementary-SCR electrostatic discharge protection circuit in a silicon substrate, coupling to I/O pads for bypassing electrostatic current of positive or negative polarity respect to power supply voltages $V_{DD}$ and $V_{SS}$. The circuit comprises a first SCR and a second SCR each having an anode, a cathode, an anode gate and a cathode gate. The circuit of the present invention preferably includes a finger type layout structure for providing a larger capacity to bypass electrostatic current. It is also characterized by a base-emitter shorting design to avoid a $V_{DD}$-to-$V_{SS}$ latch-up effect.

3 Claims, 12 Drawing Sheets

COMPLEMENTARY-SCR ELECTROSTATIC DISCHARGE PROTECTION CIRCUIT

BACKGROUND OF THE INVENTION

The present invention relates to the protection of semiconductor integrated circuits from static electricity. More particularly, this invention relates to a complementary silicon controlled rectifier (SCR) electrostatic discharge (ESD) protection circuit formed on a silicon substrate.

In order to reduce the layout area of very or ultra large scale integrated circuits, a CMOS chip of that size often has pin counts of more than two hundred pins. With such a large number of pins, the entire layout area of such a high-pin-count chip depends mostly on the pitch of input/output (I/O) pads and the electrostatic discharge protection circuits associated with the pins. If the layout areas of I/O pads with ESD protection circuits can be reduced that will improve the high speed performance of the chip due to the reduction of parasitic resistance and capacitance. However, the ESD efficiency may adversely affected as a result of smaller electrostatic current flow paths. The electrostatic protection capability of the ESD protection circuit should be enforced, or small geometry semiconductor devices in the VLSI chip can be damaged by static electricity.

Recently, a lateral SCR device has been used and proved beneficial in ESD protection circuits due to its high ESD failure threshold voltage and the fact that it lays out in a small area. See, for example, U.S. Pat. Nos. 5,140,401; 5,182,220; 4,896,234; 4,939,616; 5,010,380; 5,012,317 and 5,166,089. The ESD protection circuit, illustrated in FIG. 1, includes a first SCR 10 and a second SCR 20, coupled between voltage source $V_{DD}$ and ground $V_{SS}$, and combined in a complementary mode.

First SCR 10 consists bipolar junction transistors (BJTs) Q1 and Q2. The base of Q1 and the collector of Q2 both coupled together and via a parasitic resistance $R_{sub1}$ to an anode gate 4. Anode 3 of first SCR 10 is formed at one end of parasitic resistance $R_{w1}$, which resistance is thence coupled to the emitter of Q1. The emitter of Q2 forms a cathode 2. The collector of Q1 and the base of Q2 both are coupled together and to cathode gate 1 through parasitic resistance $R_{w2}$. Parasitic capacitors occur between electrodes of the BJTs: $C_{e1}$ between the base and emitter of Q1, $C_{c1}+C_{c2}$ between bases of Q1 and Q2, and $C_{e2}$ between base and emitter of Q2.

Anode 3 and anode gate 4 of first SCR 10 are supplied with a supply voltage $V_{DD}$. Cathode 1 coupled to an I/O pad 30 also is in electrical connection with internal circuitry 40 on the chip in which this circuit is formed. Cathode gate 1 of first SCR 10 is applied with voltage power supply $V_{SS}$.

Second SCR 20 is also formed by two BJTs, namely Q3 and Q4. The base of Q3 and the collector of Q4 are both coupled together and via a parasitic resistance $R_{sub2}$ to an anode gate 8 at a distal end of $R_{sub2}$. An anode 7 of second SCR 20 is formed at one end of a parasitic resistance $R_{w3}$, which resistance is coupled at its other end to the emitter of Q3. The emitter of Q4 forms a cathode 6 of SCR 20. The collector of Q3 and the base of Q4 are coupled together and to cathode gate 5 through resistance $R_{w4}$. There are also parasitic capacitors formed between electrodes of the BJTs: $C_{e3}$ between the base and emitter of Q3, $C_{c3}+C_{c4}$ between bases of Q3 and Q4, and $C_{e4}$ between the base and emitter of Q4.

Anode 7 of second SCR 20 is coupled to I/O pad 30 and also is in electrical connection with internal circuitry 40 of the VLSI chip. Cathode 6 and cathode gate 5 of second SCR 20 are supplied with supply voltage $V_{SS}$ (i.e. ground). Anode gate 8 is coupled to supply voltage $V_{DD}$.

An accompanying diode protection circuit 50 is also shown in the drawing. Circuit 50 is includes diodes D1 and D2. Diode D2 has its cathode 12 and anode 15 connected to parasitic resistance $R_{sub2}$ and $R_{w3}$ respectively, and electrically couple to voltage power supply $V_{DD}$ and I/O pad there through. Diode D1 couples I/O pad with its cathode 2, while its anode 14, through parasitic resistance $R_{w2}$, is applied with voltage power supply $V_{SS}$.

A cross-sectional view of the above-mentioned complementary-SCR ESD protection circuit as formed on a silicon substrate is shown in FIG. 2. The circuit is established in an N-type silicon substrate 12 utilizing standard CMOS processing. P-type wells are formed by diffusion of P-type dopant into the N-type substrate to form the complementary SCRs. First SCR 10 is formed by a parasitic lateral p-n-p BJT Q1 (please note elements 14-12-16) and a parasitic vertical n-p-n BJT Q2 (please note elements 2-14-12). Second SCR 20 is formed by a lateral p-n-p BJT Q3 (please note elements 13-12-15) and a vertical n-p-n BJT Q4 (please note elements 6-13-12). Lateral p-n-p BJTs Q1 and Q3 use p-type wells 15 and 16 instead of heavily doped p-type regions as emitters to increase their current gains. At the same time, the deeper the emitter of a lateral BJT, the larger amount of current can flow there through, and also the higher the failure threshold voltage.

Junction diodes D1 and D2, referring to FIG. 2, are in coincidence with base-emitter junctions of BJT Q2 and Q3, respectively. That is, the base-emitter junctions of the two BJTs also form diodes D1 and D2, and no additional diffusion region is necessary for the formation of the diodes. Diode D1 is formed by heavily doped n-type region 2 and P-type well 14, and D2 is formed by P-type well 15 and N-type substrate 12.

Since a CMOS VLSI circuit normally operates between a higher voltage $V_{DD}$ of 5V and a lower voltage $V_{SS}$ of 0V, diodes D1 and D2 provide a voltage-clamping circuit. Voltage levels of input signals are confined to a range of −0.5 to +5.5V by the voltage clamping effect of diodes D1 and D2. Although diodes D1 and D2 coincide with emitters of BJTs Q2 and Q3, the current flow paths through diodes are not the same as that through SCRs 10 and 20. Therefore, as diodes D1 or D2 conduct due to an over voltage condition at I/O pad 30, lateral SCRs 10 and 20 with their high impedance states are not triggered on.

There are four categories of ESD-stress at the input pad with positive or negative polarities respect to voltage power supply $V_{DD}$ or $V_{SS}$. They are:

1. Diode D1 conducts forwardly to bypass ESD current but second SCR 20 is in its off state, if ESD-stress is negative polarity respect to $V_{SS}$;

2. Diode D2 conducts forwardly to bypass ESD current but first SCR 10 is in its off state, if ESD-stress is positive polarity respect to $V_{DD}$;

3. Second SCR 20 is triggered on to bypass ESD current but diode D1 is off, if ESD-stress is positive polarity respect to $V_{SS}$; and 4. First SCR 10 is triggered on to bypass ESD current but diode D2 is off, if ESD-stress is negative polarity respect to $V_{DD}$.

However, there exists a parasitic latch-up path between voltage power supplies $V_{DD}$ and $V_{SS}$ in the above described ESD protection circuit. The so-called $V_{DD}$-to-$V_{SS}$ latch-up path is contributed by BJT Q4 and parasitic BJT Q5, referring to FIG. 3, wherein Q4 is the same n-p-n BJT previously described with reference to second SCR 20. The $V_{DD}$-to-$V_{SS}$ latchup path is shown by the dashed line in FIG. 3. As can be seen in FIG. 2, BJT Q5 has its emitter formed by P-type well 16, that is, the emitter of Q1, its base by a relatively wide spacing in N-type substrate 12, and its collector by P-type well 13, that is, also the collector of Q4. If first and second SCRs 10 and 20 are separated by a relatively wide pad layout, BJT Q5 will have a very small beta gain due to the relatively large size of its base width. Beta gain of vertically oriented BJT Q4 can also be reduced by enlarging the depth difference of its emitter doping region 6 and P-type well 13. However, the beta gain of a vertical BJT constructed using submicron CMOS technology is ordinarily as high as 100 to 200, and thus $V_{DD}$-to-$V_{SS}$ latch-up may occur in the ESD protection circuit if resistance $R_{sub1}$ and $R_{w4}$ are large enough. If $R_{sub1}$ and $R_{w4}$ are reduced, the $V_{DD}$-to-$V_{SS}$ latchup can be overcome.

BRIEF SUMMARY OF THE INVENTION

The present invention to provides a complementary-SCR electrostatic discharge protection circuit in a silicon substrate, wherein lateral SCRs are formed with finger-type layout structures to increase ESD current paths and reduce their area.

The present invention provides a complementary-SCR electrostatic discharge protection circuit in a silicon substrate, wherein base-emitter shorting and guard ring structures are employed to prevent the $V_{DD}$-to-$V_{SS}$ latch-up effect.

The present invention provides a complementary-SCR electrostatic discharge protection circuit in a silicon substrate, wherein spacings of adjacent wells are made as narrow as possible to increase the failure threshold voltage.

These and other features or aspects of the present invention are provided by a complementary-SCR electrostatic discharge protection circuit in a silicon substrate, coupling to I/O pads for bypassing electrostatic current of positive or negative polarity respect to voltage power supplies $V_{DD}$ or $V_{SS}$. The circuit comprises a first SCR and a second SCR both having their anode, cathode, anode gate and cathode gate. The circuit of the present invention is characterized by its finger type layout structure for providing a larger capacity to bypass electrostatic current. It is also characterized by an base-emitter shorting design to avoid the $V_{DD}$-to-$V_{SS}$ latch-up effect.

DETAILED DESCRIPTION OF THE INVENTION

Figure 1:
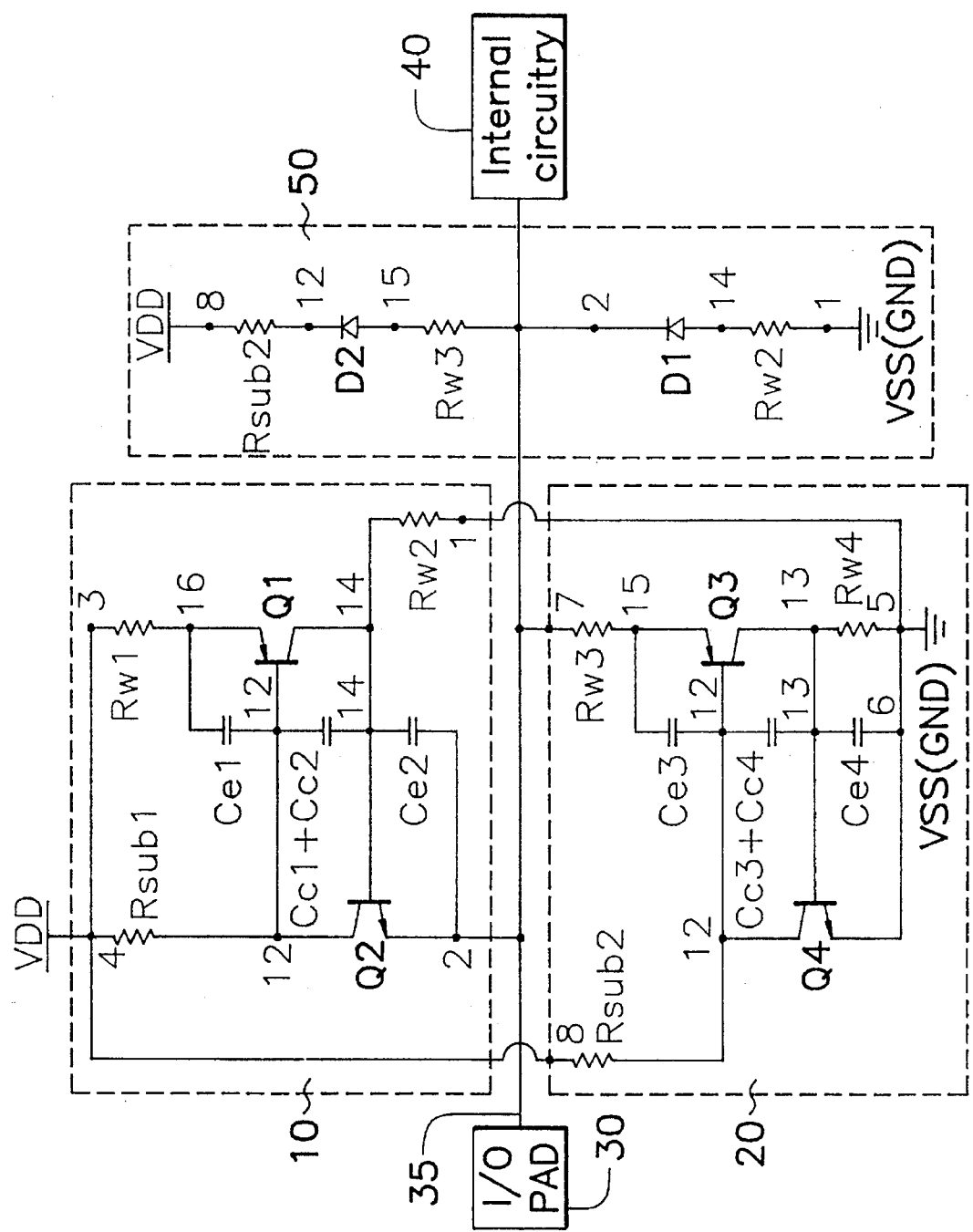
FIG. 1 illustrates an electrostatic discharge protection circuit as an application of complementary SCRs.
Figure 2:
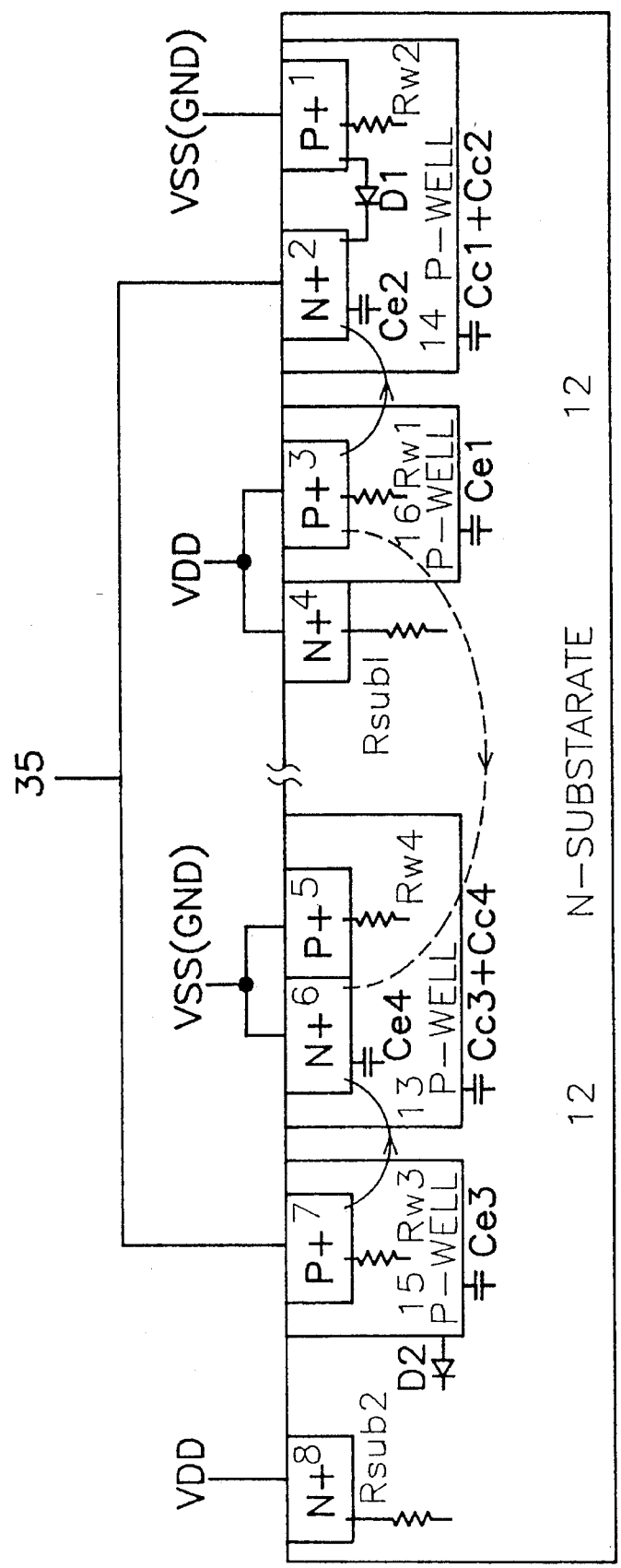
FIG. 2 is a cross-sectional view, illustrating the circuit according to FIG. 1 formed on a silicon substrate.
Figure 3:
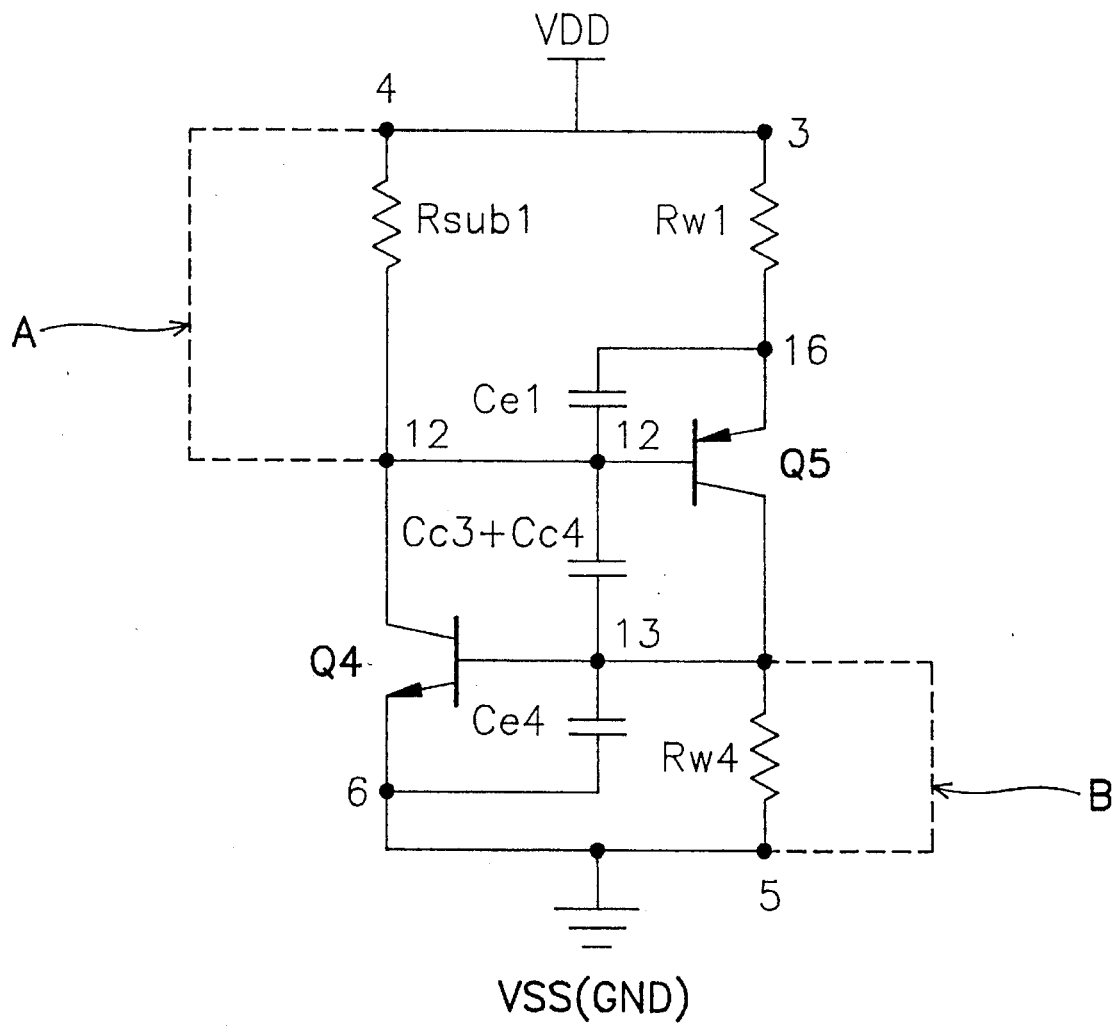
FIG. 3 illustrates a circuit giving rise to parasitic latch-up effect according to the structure of FIG. 2.

FIG. 3 shows the parasitic latch-up circuit between the voltage power supplies $V_{DD}$ and $V_{SS}$, as mentioned above. The values of parasitic resistance $R_{sub1}$ and $R_{w4}$ have a great effect on the occurrence of latch-up in the protection circuit. Resistance $R_{sub1}$ comes out from the non-uniformity of potential distribution in silicon substrate due to the broadness of silicon substrate. The distance from bias point of the silicon substrate to any point in the well gives birth to the parasitic resistance $R_{w4}$.

In order to suppress the latch-up effect between voltage sources $V_{DD}$ and $V_{SS}$, a base-emitter shorting method is employed in the design of the protection circuit to reduce $R_{sub1}$ and $R_{w4}$. Referring to FIG. 3, dashed lines A and B provide paths in parallel relationship with $R_{sub1}$ and $R_{w4}$, respectively, and therefore they reduce the effective resistance across nodes 4 and 12 and nodes 5 and 13. Dashed line A is realized by forming a heavily doped n-type region 4 adjacent to p-type well 16 please note elements connected to $V_{DD}$. At the same time, in case of dashed line B, heavily doped P-type region 5 is formed adjacent to emitter of BJT Q4 and connected with voltage source $V_{SS}$, thereby decreasing the effective resistance between nodes 5 and 13. The holding voltage at which $V_{DD}$-to-$V_{SS}$ latch-up occurs can be higher than 5V by this base-emitter shorting technique and thus the protection circuit can be free of this parasitic latch-up effect.

Figure 4A:
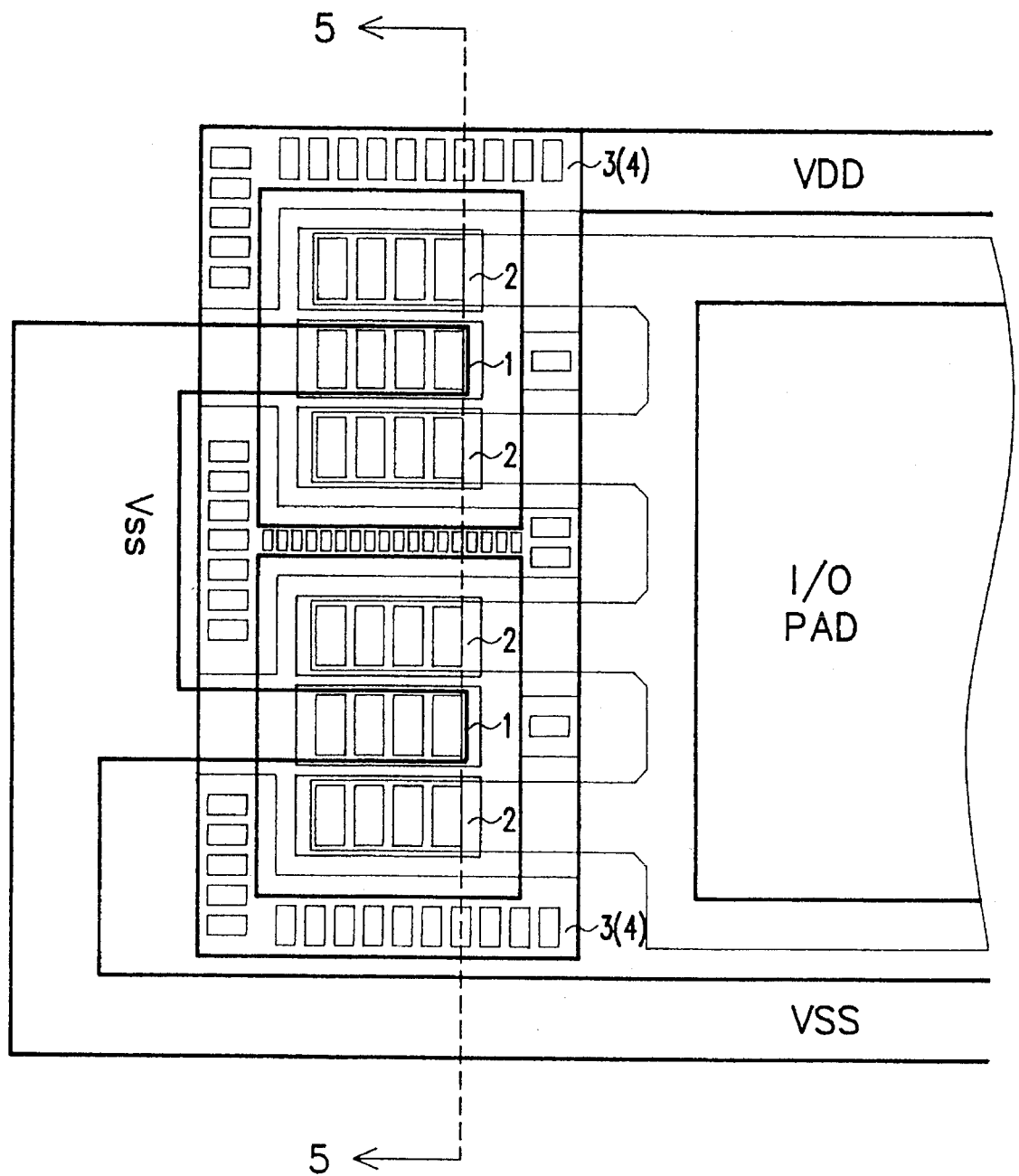
FIG. 4A and FIG. 4B are top views of the circuit structure on a silicon substrate in accordance with a preferred embodiment of the invention.
Figure 4B:
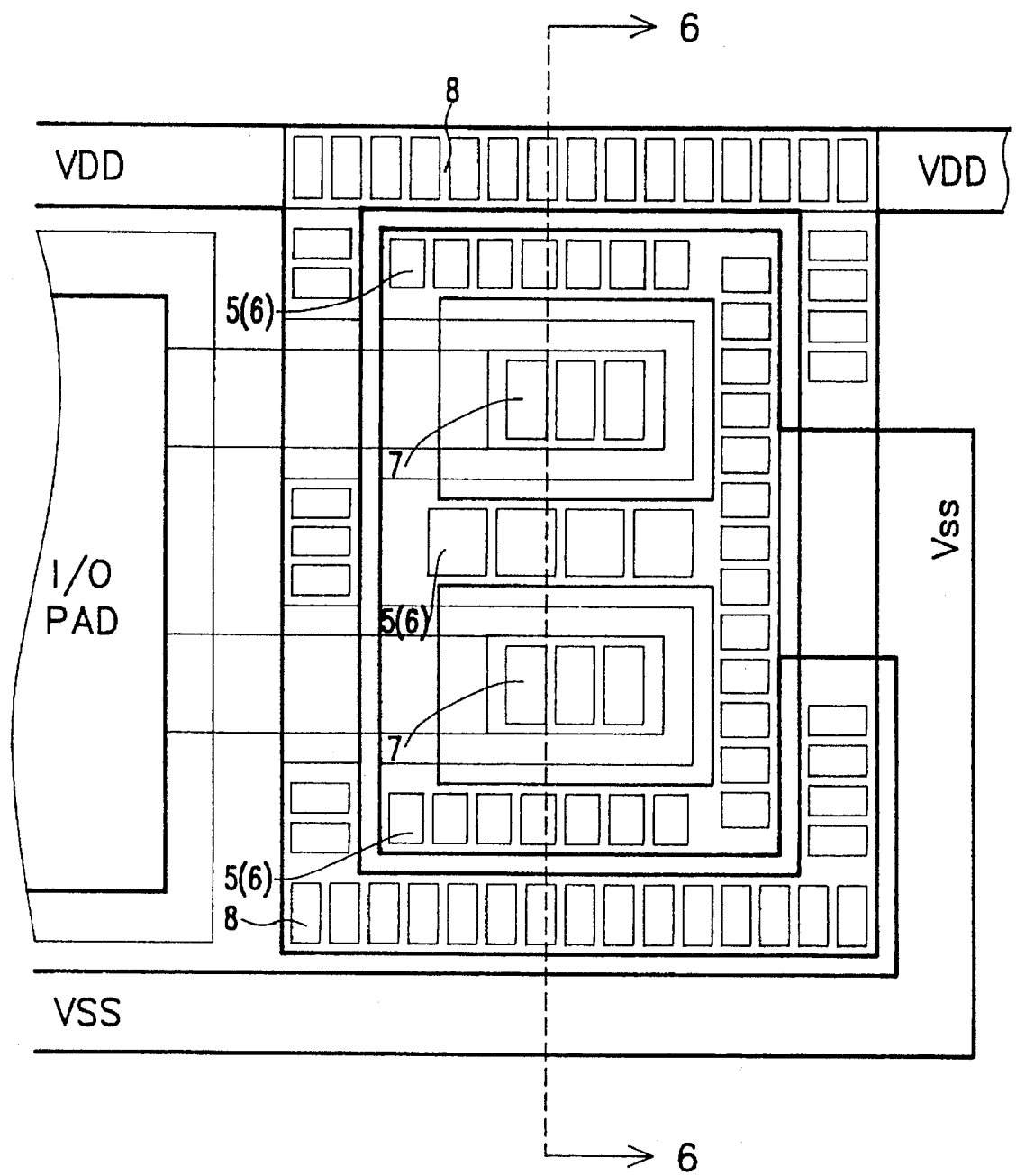

On the other hand, in order to increase ESD current flow paths to avoid current crowding effects in anode areas of first and second SCR as well as to avoid electromigration in metal lines and contacts, an interdigitated finger-type layout style is preferably used in the ESD protection circuit according to the present invention. FIG. 4A and FIG. 4B are top views of an ESD protection circuit in accordance with a preferred embodiment of the present invention. As will be seen in FIG. 4A, four fingers extend, in a first direction, from I/O pad 30 to the left in this figure to form first SCR 10 with voltage source $V_{DD}$. Similarly, two fingers extend in FIG. 4B, in the first direction, from I/O pad 30 to the right to form second SCR 20 with voltage source $V_{SS}$, as will be described with reference to FIG. 6.

Figure 5:
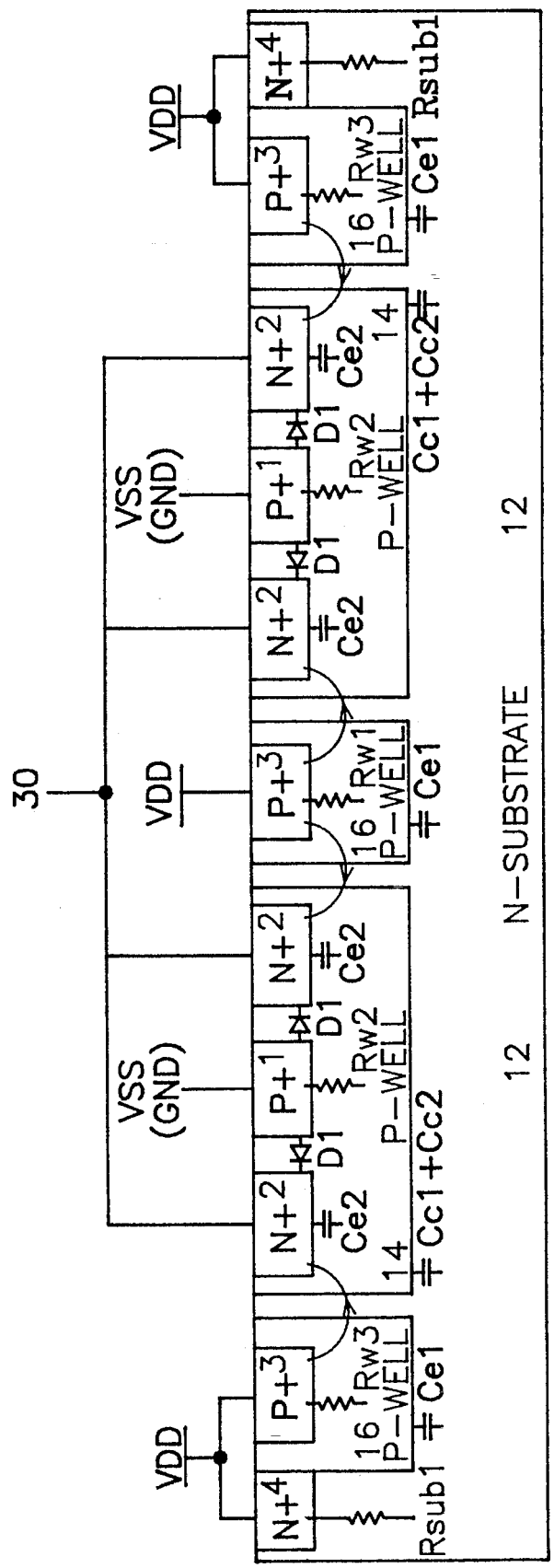
FIG. 5 is a cross-sectional view of the circuit in FIG. 4A taken through lines 5—5.

Referring now to FIG. 5, which is a cross-sectional view of ESD circuit in FIG. 4A taken through lines 5—5, the cathode of first SCR 10 is provided by four heavily doped regions 2. They are connected with I/O pad 30 in two p-wells 14 that are each supplied by voltage source $V_{SS}$. P-well 14 is encircled by p-well 16 that constitutes the anode of first SCR 10 and is supplied by voltage source $V_{DD}$. Diode D1 is formed by heavily doped P-type region 1 and cathode 2 of first SCR 10. A heavily doped n-type region encircles and adjacent to p-well anode 16 of first SCR 10 in substrate 12 and is applied with voltage $V_{DD}$ to bias substrate 12.

Figure 6:
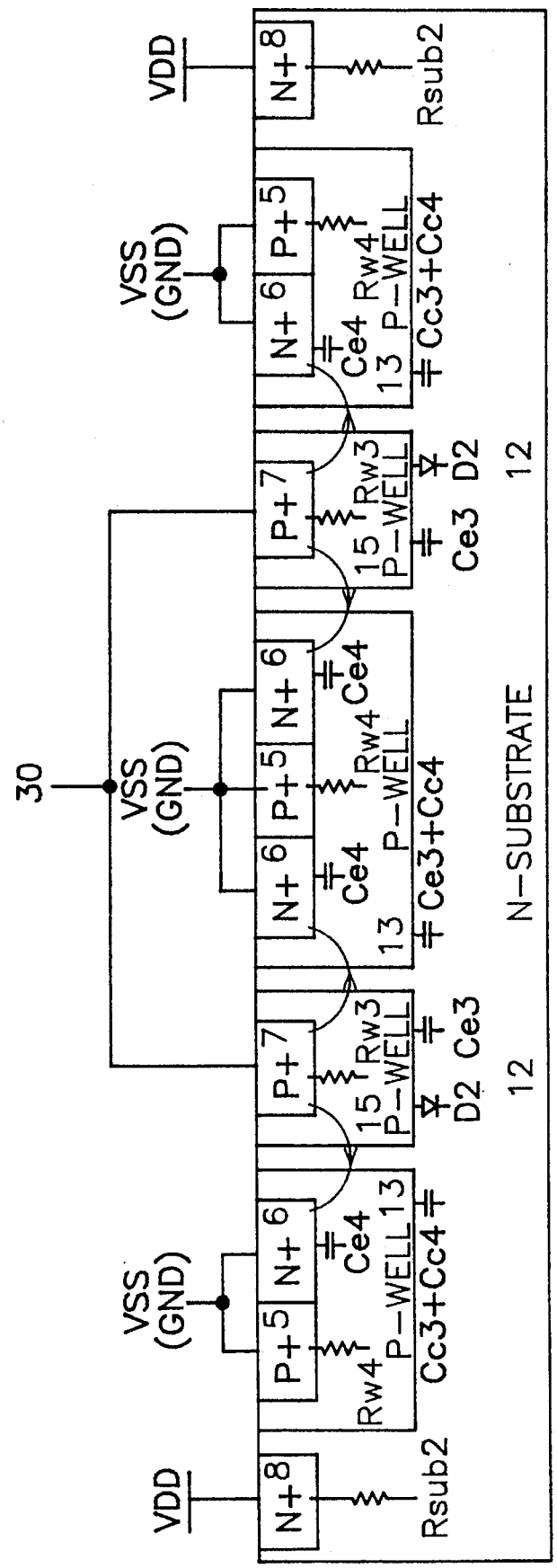
FIG. 6 is a cross-sectional view of the circuit in FIG. 4B taken through lines 6—6.

At the same time, second SCR 20, as shown in FIG. 6 that is a cross-sectional view taken through lines 6—6 in FIG. 4B, has its anode formed by two heavily doped p-type regions 7 in p-well 15. P-well 15 is surrounded by p-well 13 that includes the cathode of second SCR 20. The cathode of second SCR 20 is formed by heavily doped n-type regions 6 which are connected to voltage source $V_{SS}$ in p-well 13. In the same p-well 13, another heavily doped p-type region 5 adjacent to cathode 6 circulates overall second SCR 20 and is applied with voltage source $V_{SS}$ to bias p-well 13. Diode D2 has its cathode formed by heavily doped n-type region 8 that applies the $V_{DD}$ voltage to substrate 12, and has its anode that is in coincidence with anode 7 of second SCR 20 connected with I/O pad 30. Other associated parasitic resistances and capacitances are also shown in the drawing.

The above-mentioned ESD protection structure provides more ESD current flow paths in order to have a relatively high ESD failure threshold voltage in a small layout area.

Referring again to FIG. 4A and 4B, $V_{DD}$-to-$V_{SS}$ latch-up occurs from anode 3 of first SCR 10, which is formed by heavily doped p-type diffusion region 3, through substrate 12 under I/O pad 30 to cathode 6 of second SCR 20, which is formed by heavily doped n-type diffusion region 6. In first SCR 10, as shown in FIG. 4A and 5, heavily doped n-type region 4 encircles closely to p-well anode 3 therefore providing a base-emitter shorting effect to decrease resistance $R_{sub1}$. At the same time, in second SCR 20, referring to FIG. 4B and 6, heavily doped p-type region 5 circulates closely to n-type cathode 6 therefore providing a base-emitter shorting effect to decrease resistance $R_{w4}$. In addition, heavily doped n-type region 8 surrounds overall second SCR 20 as a guard ring in silicon substrate 12, it is also provided for suppressing the parasitic latch-up effect.

Effective values of parasitic resistance $R_{sub1}$ and $R_{w4}$ are reduced by utilizing the base-emitter shorting structure described above. In order to improve the latching performance of first SCR 10 and second SCR 20, the spacing between wells that form BJT Q1 and Q3 should be optimized by shorter spacings to increase their beta gains. As a result of short spacing between wells, voltage which causes punchthrough is lower than that which causes breakdown between wells, and DC switching voltages of both SCRs decrease. Therefore, in cases where the SCRs have lower switching voltages and BJTs have higher beta gains, the ESD protection circuit is easily triggered on to improve its current discharge capability.

According to the layout style in FIG. 4A and 4B, a 0.6 µm twin-well n-substrate CMOS static random access memory (SRAM) technology has been applied to fabricate the ESD protection circuit. Layout area of first SCR 10 with diode D1 is 108×44 µm². Layout area of second SCR 20 with diode D2 is 108×76 µm² which includes the surrounding heavily doped n-type guard ring region with ring width of 10 µm.

Figure 7:
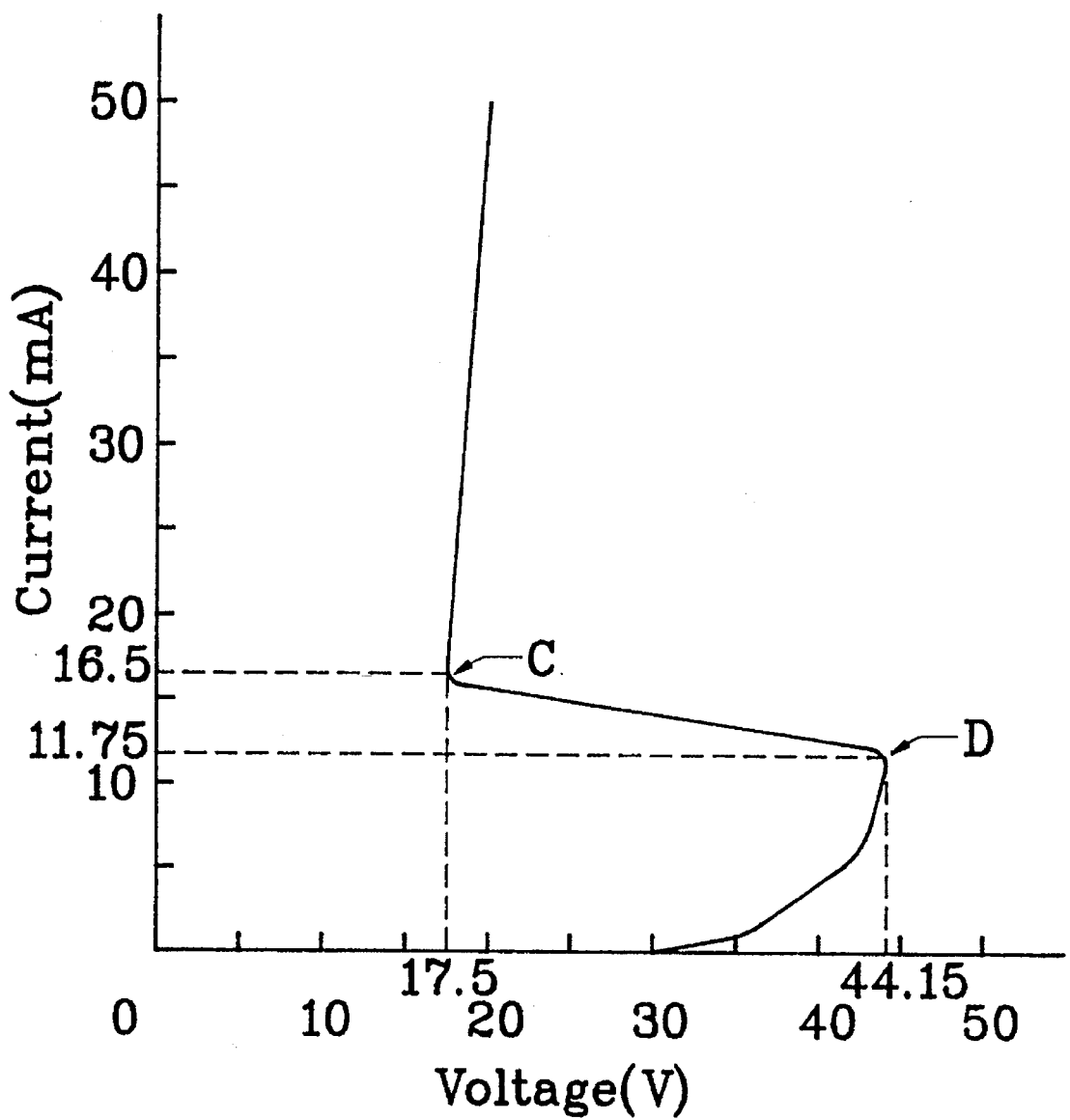
FIG. 7 illustrates the DC voltage-current characteristics due to the parasitic latch-up effect in accordance with the structure in FIG. 4A and 4B.

The measured DC voltage-current characteristics of the $V_{DD}$-to-$V_{SS}$ latch-up path in the ESD protection circuit as described above is shown in FIG. 7, wherein DC holding voltage, i.e., point C, is about 17.5V, which is higher than the 5V $V_{DD}$ power supply. As the spacing between the wells of ESD protection circuit changes from 1.4 µm to 3.0 µm, the DC holding voltage according to the present invention also changes between 16 and 18V. Thus, the ESD protection circuit, in accordance with the invention, is free from a parasitic latch-up issue.

Figure 8:
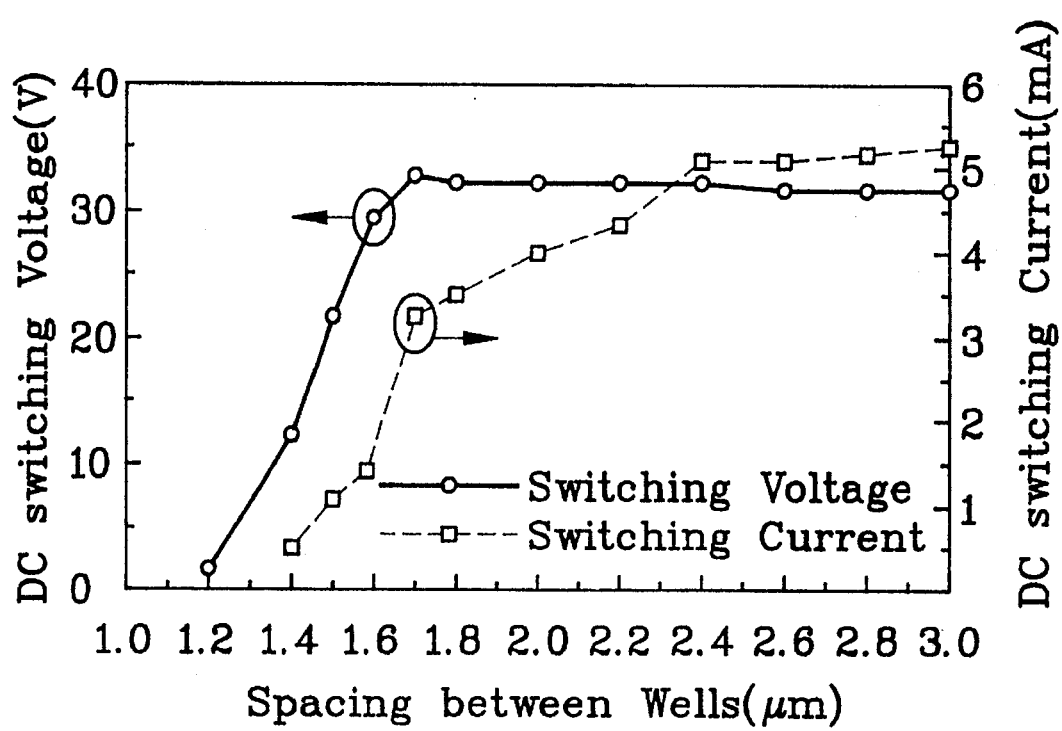
FIG. 8 illustrates the DC switching voltage and current increase versus well to well spacing in accordance with the structure in FIG. 4A and 4B.

FIG. 8 illustrates the relationships between the DC switching voltage and the spacing between the wells of first SCR 10. In case of spacings larger than 1.6 µm, the switching voltage keeps around 30V as a result of p-well to n-substrate breakdown. When the spacing the is less than 1.6 µm, the DC switching voltage decreases almost linearly as the spacing decreases due to punchthrough effects between wells. Second SCR 20 has similar turn-on performance as that of first SCR 10 mentioned above.

The turn-on resistance of SCR that has a spacing between the wells in a range of 1.2 to 3.0 µm is around 1.6 to 2.0Ω. The ESD protection circuit therefore provides quite efficient discharge paths to bypass electrostatic current as a result of such a low turn-on resistance.

Figure 9:
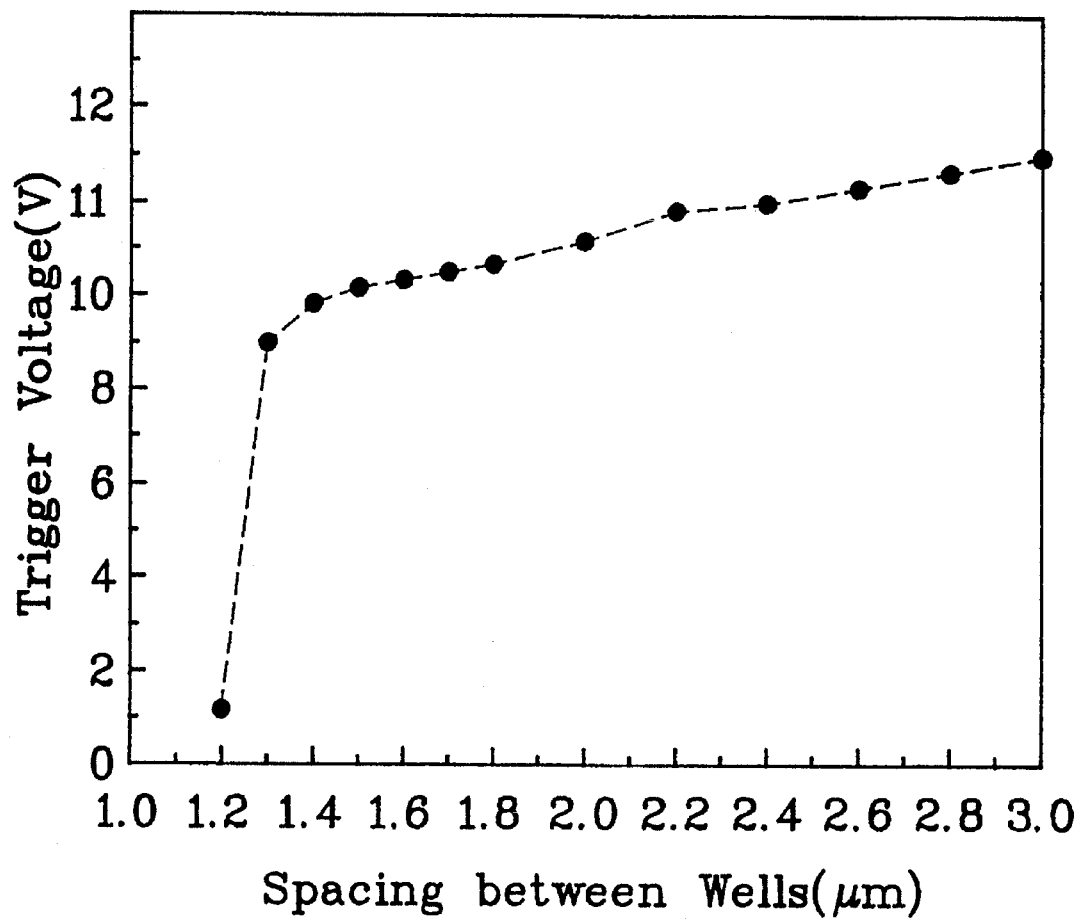
FIG. 9 shows the relationship between the trigger voltage and well to well spacing in accordance with the structure in FIG. 4A and 4B.

Since the junction capacitance in a SCR provides transient current to turn on the ESD protection circuit, the trigger voltage can be lower than the DC switching voltage in the ESD protection circuit. Referring to FIG. 9, which shows the relationships between pulse-type trigger voltage and spacing between wells, for a spacing between wells is 1.4 µm, its corresponding pulse-type trigger voltage is 9.02V. As the spacing increases to 3.0 µm, the pulse-type trigger voltage also increases to 11.78V.

The ESD protection circuit in accordance with a preferred embodiment of the invention has been tested by Human-Body-Mode (HBM) and Machine-Mode (MM) ESD testers with different spacings between wells.

Figure 10:
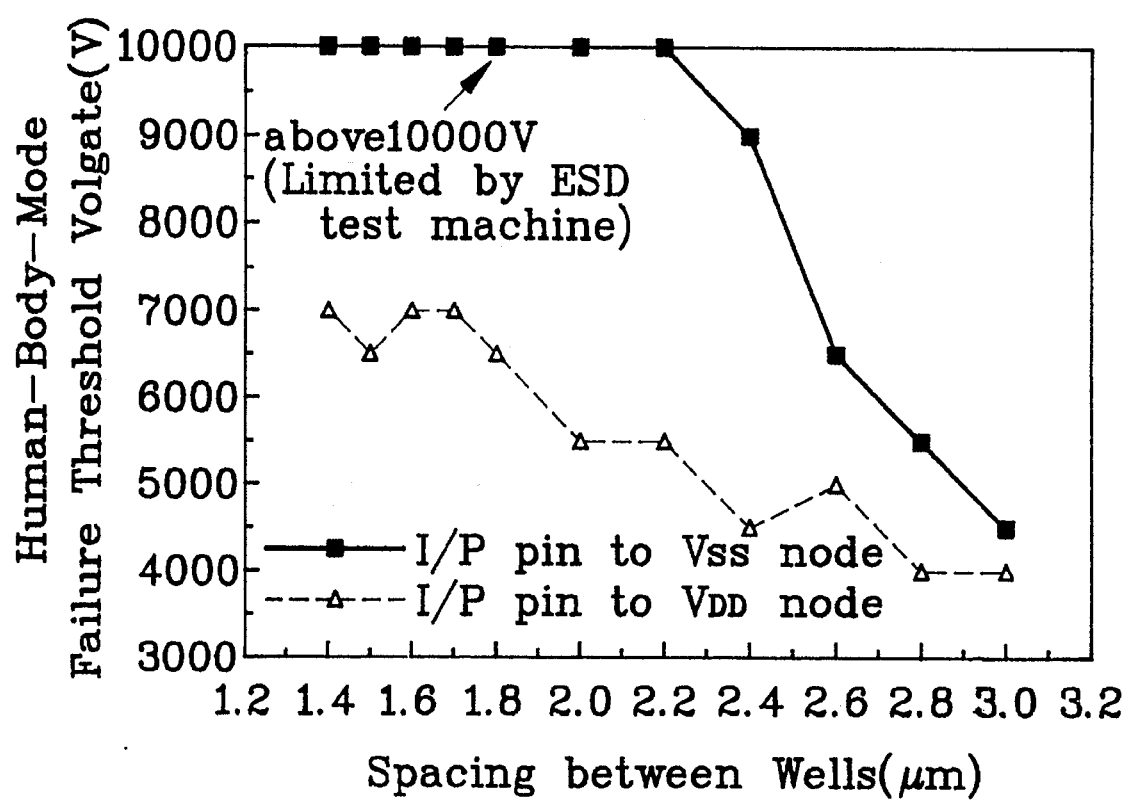
FIG. 10 shows the relationship between Human-Body-Mode ESD failure threshold voltage and well to well spacing in accordance with the structure in FIG. 4A and 4B.

FIG. 10 illustrates the HBM failure threshold voltage versus spacing between wells in the ESD protection circuit. When the spacing between wells less than 1.8 µm, the failure threshold voltage from I/O pins to voltage source $V_{SS}$ is above 10 KV, whereas that from I/O pins to voltage source $V_{DD}$ is also above 6500V.

Figure 11:
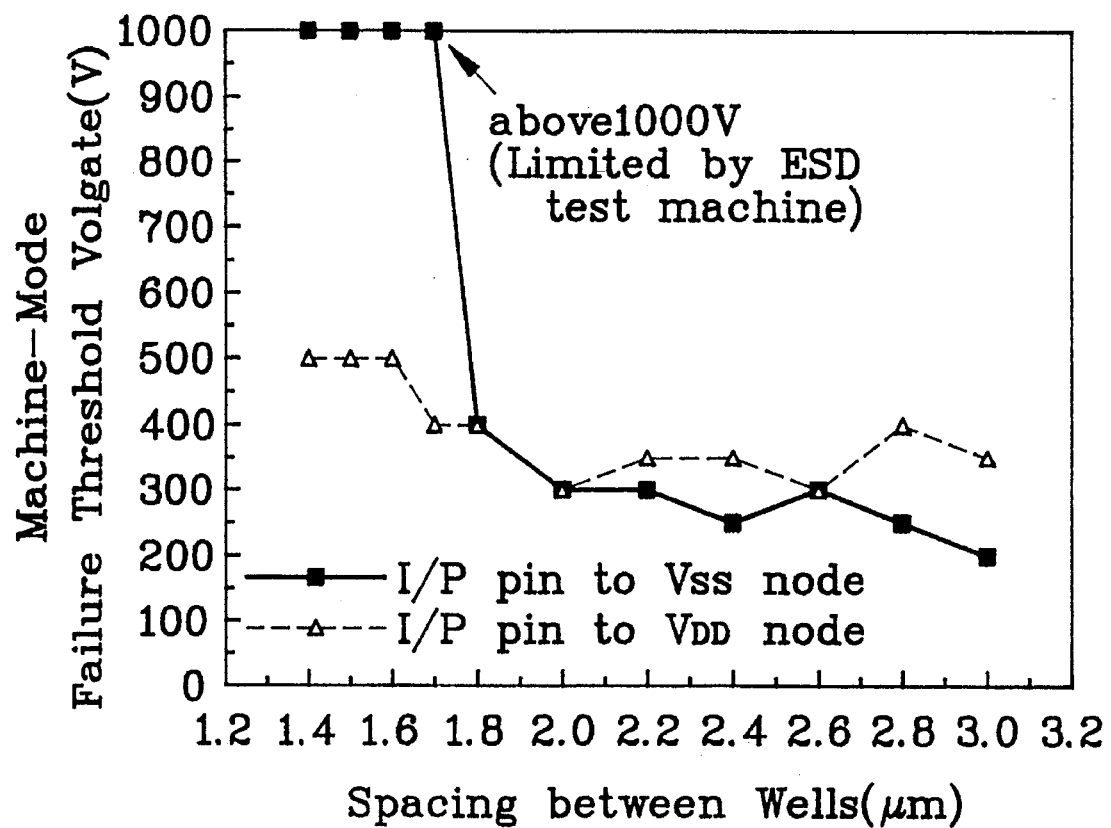
FIG. 11 shows the relationship between Machine-Mode ESD failure threshold voltage and well to well spacing in accordance with the structure in FIG. 4A and 4B.

Refer to FIG. 11, which shows the relationships between the MM ESD failure threshold voltage and the spacing between wells in the ESD protection circuit. The failure threshold voltage from I/O pins to voltage source $V_{SS}$ is above 1 KV and that from I/O pins to voltage source $V_{DD}$ is above 400V for spacing between wells less than 1.8 µm.

When spacing between wells increases from 1.8 to 3.0, the HBM and MM ESD failure threshold voltages decrease to around 4000V and 200V, respectively. Therefore, a shorter spacing between wells in the invention causes a higher ESD failure threshold voltage to occur.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. For example, as an alternative to forming BJTs by p-wells in an N-substrate, BJTs can be alternatively formed by n-wells in a p-substrate, instead. Other integrated circuit structures such as twin-well CMOS or BiCMOS may alternatively replace the p-well BJT structure. It is therefore contemplated that the appended claims cover any such alternations or modifications as fall within the scope and spirit of the invention.

What is claimed is:

1. A complementary-SCR electrostatic discharge protection circuit formed on a silicon substrate of a first conductivity type, wherein a first SCR, an I/O pad and a second SCR are arranged sequentially in a first direction on said silicon substrate; said complementary-SCR electrostatic discharge protection circuit comprising:

a first well of a second conductivity type formed on said silicon substrate, wherein a plurality of regions of first conductivity type are formed along said first direction and electrically coupled to said I/O pad to define cathodes of said first SCR, and at least one region of second conductivity type for coupling with a first voltage is formed between said regions of first conductivity type to define a cathode gate of said first SCR;

a second well of second conductivity type formed on said silicon substrate closely circulating said first well, wherein at least one region of second conductivity type for coupling with a second voltage and defines an anode of said first SCR;

a region of first conductivity type formed on said silicon substrate, adjacent to said second well, for coupling with said second voltage to define an anode gate of said first SCR;

a plurality of third wells of second conductivity type formed on said silicon substrate along said first direction, wherein at least one region of first conductivity type is arranged in said first direction for coupling with said first voltage to define a cathode of said second SCR, and at least one region of second conductivity adjacent to said region of first conductivity type applied with said first voltage to become a cathode gate of said second SCR;

a fourth well of second conductivity type formed between said third wells on said silicon substrate, wherein at least one region of second conductivity type located along said first direction is coupled electrically to said I/O pad and defines an anode of said second SCR; and a region of first conductivity type formed on said silicon substrate, encircling said third wells and said fourth wells, for coupling said second voltage and defining an anode gate of said second SCR.

2. The complementary-SCR electrostatic discharge protection circuit as claimed in claim 1, wherein said silicon substrate of first conductivity type is an n-type silicon substrate; said wells of second conductivity type are p-type wells; said regions of first conductivity type are heavily doped N-type regions; and said regions of second conductivity type are heavily doped P-type regions.

3. The complementary-SCR electrostatic discharge protection circuit as claimed in claim 1, wherein said silicon substrate of first conductivity type is a p-type silicon substrate; said wells of second conductivity type are n-type wells; said regions of first conductivity type are heavily doped p-type regions; and said regions of second conductivity type are heavily doped n-type regions.

* * * * *